US011380604B2

(12) United States Patent
Joshi et al.

(10) Patent No.: US 11,380,604 B2
(45) Date of Patent: Jul. 5, 2022

(54) METHODS OF FORMING ELECTRONIC ASSEMBLIES WITH TEXTURED SURFACES USING LOW CURRENT DENSITY ELECTROPLATING

(71) Applicants: Toyota Motor Engineering & Manufacturing North America, Inc., Plano, TX (US); The Board of Trustees of the University of Illinois, Champaign, IL (US)

(72) Inventors: Shailesh N. Joshi, Ann Arbor, MI (US); Paul Braun, Champaign, IL (US); Julia Kohanek, Champaign, IL (US); Gaurav Singhal, Maharashtra (IN)

(73) Assignees: TOYOTA MOTOR ENGINEERING & MANUFACTURING NORTH AMERICA, INC., Plano, TX (US); THE BOARD OF TRUSTEES OF THE UNIVERSITY OF ILLINOIS, Champaign, IL (US)

( * ) Notice: Subject to any disclaimer, the term of this patent is extended or adjusted under 35 U.S.C. 154(b) by 324 days.

(21) Appl. No.: 16/696,120

(22) Filed: Nov. 26, 2019

(65) Prior Publication Data

US 2021/0159146 A1 May 27, 2021

(51) Int. Cl.
*H01L 23/427* (2006.01)
*F28D 15/02* (2006.01)
*H01L 21/48* (2006.01)

(52) U.S. Cl.
CPC ........ *H01L 23/427* (2013.01); *F28D 15/0266* (2013.01); *H01L 21/4882* (2013.01)

(58) Field of Classification Search
None
See application file for complete search history.

(56) References Cited

U.S. PATENT DOCUMENTS

| 4,407,695 A | * | 10/1983 | Deckman | B41M 5/24 |
| | | | | 257/E21.232 |
| 8,580,100 B2 | | 11/2013 | Feng et al. | |
| 2006/0202392 A1 | * | 9/2006 | Zheng | H01L 29/42332 |
| | | | | 257/E21.209 |
| 2013/0026441 A1 | * | 1/2013 | White | B82Y 20/00 |
| | | | | 438/57 |
| 2015/0308006 A1 | | 10/2015 | Cohen et al. | |

FOREIGN PATENT DOCUMENTS

| CN | 105386090 B | 5/2018 | |
| CN | 106086944 B | 6/2018 | |
| JP | 4032056 B2 | 1/2008 | |
| KR | 20110116982 A | 10/2011 | |
| SG | 146672 A1 * | 10/2008 | ......... B81C 1/00047 |

* cited by examiner

*Primary Examiner* — Evren Seven
(74) *Attorney, Agent, or Firm* — Dinsmore & Shohl LLP

(57) ABSTRACT

A method of forming a textured surface layer along a substrate that includes disposing a plurality of polymer spheres on a surface of the metal substrate, and electroplating the metal substrate at a current density to deposit a metal layer along a body of each of the plurality of polymer spheres disposed on the surface of the metal substrate. The metal layer does not extend above a top surface of the plurality of polymer spheres. The method further includes removing the plurality of polymer spheres from the metal layer to form the textured surface defined by a size and shape of the plurality of polymer spheres.

12 Claims, 5 Drawing Sheets

METHODS OF FORMING ELECTRONIC ASSEMBLIES WITH TEXTURED SURFACES USING LOW CURRENT DENSITY ELECTROPLATING

BACKGROUND

Field

The present specification generally relates to electronics assemblies, and more particularly, to methods of forming textured surfaces on substrates of power electronic assemblies by utilizing low current density during an electroplating process.

Technical Background

As electronics assemblies are designed to operate at increased power levels, thereby generating more heat due to the demands of electrical systems, conventional heat sinks are unable to adequately remove sufficient heat to effectively lower the operating temperature of the power electronics devices to acceptable temperature levels. Further, conventional heat sinks and cooling structures require additional bonding layers and thermal matching materials (e.g., bond layers, substrates, thermal interface materials). These additional layers add substantial thermal resistance to the overall assembly and make thermal management of the electronics system challenging.

Some cooling devices used to cool electronic devises utilize a cooling fluid to remove heat flux generated by the electronic device. Particularly, two-phase cooling devices remove heat flux by changing a cooling medium from a liquid to a gas. Textured surfaces provide additional nucleation sites for the cooling medium to boil. Thus, textured surfaces promote boiling better than a relatively smooth surface.

SUMMARY

In one embodiment, a method of forming a textured surface layer along a metal substrate including disposing a plurality of polymer spheres on a surface of the metal substrate, and electroplating the metal substrate at a current density to deposit a metal layer along a body of each of the plurality of polymer spheres disposed on the surface of the metal substrate. The metal layer does not extend above a top surface of the plurality of polymer spheres. The method further includes removing the plurality of polymer spheres from the metal layer to form the textured surface defined by a size and shape of the plurality of polymer spheres.

In another embodiment, a method for bonding a semiconductor device to a metal substrate that includes a textured surface, the method including depositing a plurality of polymer spheres on a first surface of the metal substrate, and electroplating the metal substrate at a current density to deposit a metal layer along a bottom surface of the plurality of polymer spheres. The metal layer does not extend above a top surface of the plurality of polymer spheres. The method includes dissolving the plurality of polymer spheres to form a texture surface on the metal layer positioned along the metal substrate and bonding the semiconductor device onto a second surface of the metal substrate.

In yet another embodiment, an electronic assembly includes a metal substrate comprising a first surface and a second surface, an electroplated metal layer disposed on the first surface of the metal substrate, the electroplated metal layer including a textured surface defined by a plurality of protrusions and a plurality of dimples formed along the metal substrate such that each dimple of the plurality of dimples is disposed between and defined by adjacent protrusions of the plurality of protrusions. The electronic assembly further includes a semiconductor device bonded to the second surface of the metal substrate.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, wherein like structure is indicated with like reference numerals and in which:

DETAILED DESCRIPTION

Figure 1:
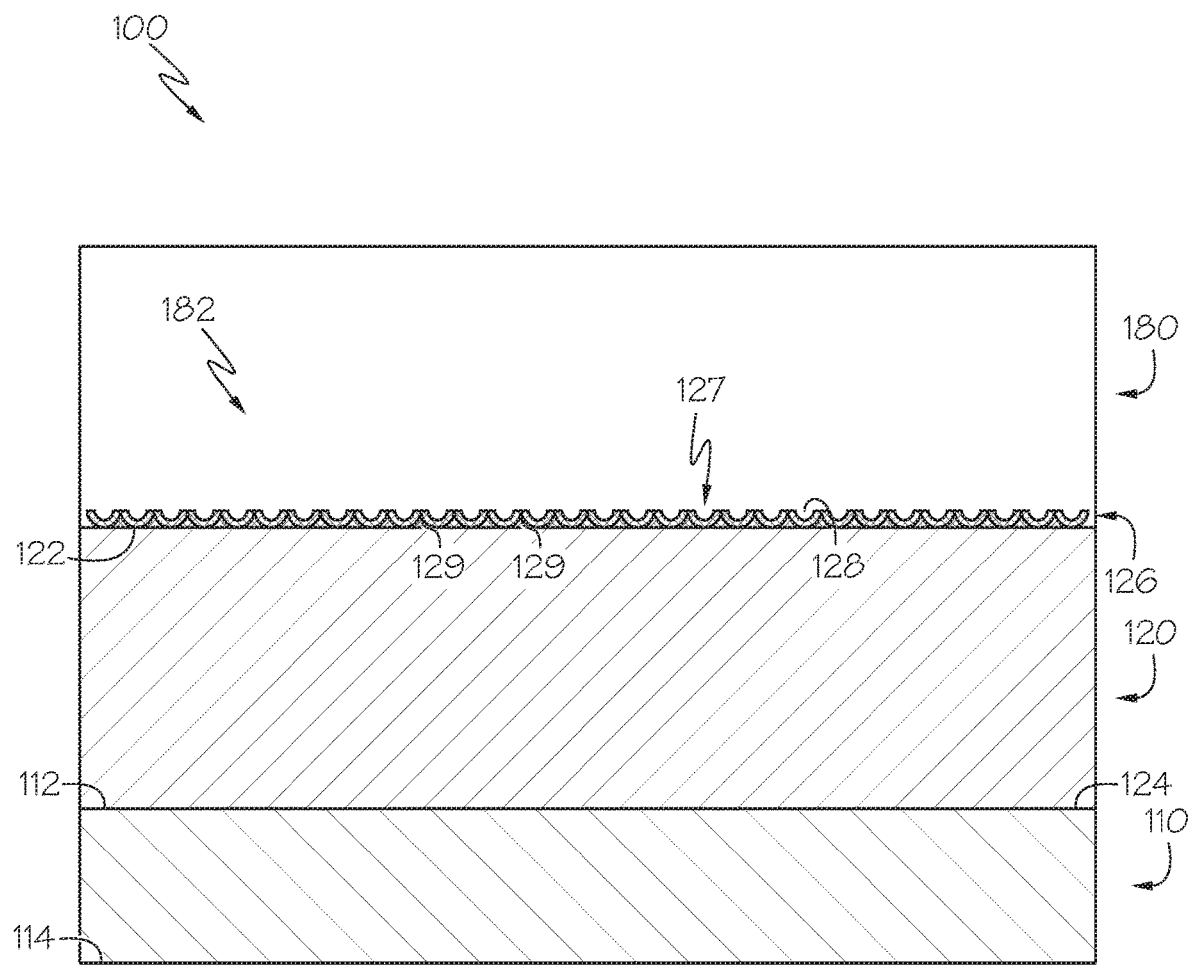
FIG. 1 schematically depicts an illustrative cross-sectional side view of an assembly having a device substrate thermally bonded to a metal substrate, with the metal substrate including a textured surface according to one or more embodiments shown and described herein.

Electronics assemblies are often utilized in high-power electrical applications, such as inverter systems for hybrid electric vehicles and electric vehicles. Such power electronics assemblies include power semiconductor devices such as power insulated-gate bipolar transistors (IGBTs) and power transistors thermally bonded to a metal substrate. In embodiments, components of power electronic assemblies, such as a metal substrate, may include textured surfaces formed thereon during an electroplating process of the power electronic assembly to provide enhanced nucleation sites for receiving a cooling fluid therein, such as, for example, a coolant from a cooling apparatus.

It should be understood that the substrates (e.g., power semiconductor devices) and assemblies (e.g., power electronics assemblies) described herein may be incorporated into an inverter circuit or system that converts direct current electrical power into alternating current electrical power and vice versa depending on the particular application. For example, in a hybrid electric vehicle application (not shown), several power electronics assemblies may be electrically coupled together to form a drive circuit that converts direct current electrical power provided by a bank of batteries into alternating electrical power that is used to drive an electric motor coupled to the wheels of a vehicle to propel the vehicle using electric power. The power electronics assemblies used in the drive circuit may also be used to convert alternating current electrical power resulting from use of the electric motor and regenerative braking back into direct current electrical power for storage in the bank of batteries.

Power semiconductor devices may generate a significant amount of heat during operation, which require bonds between the semiconductor device and the metal substrate that can withstand higher temperatures and thermally-induced stresses due to coefficient of thermal expansion (CTE) mismatch. The textured surfaces described and illustrated herein may compensate for the thermally-induced stresses generated during use of the semiconductor device by manageably controlling the thermal expansion and/or stiffness experienced by the layers of the metal substrate and semiconductor devices through receipt of cooling fluids thereon. In other words, the textured surfaces may provide a structure in a two-phase cooling apparatus for cooling the semiconductor devices during operation of the power electronics assemblies.

The present disclosure relates generally to a method for forming the power electronic assemblies described above including a power semiconductor device bonded to a metal substrate with one or more of the devices of the assembly, such as, for example, the metal substrate, having a textured surface formed thereon during an electroplating process when forming the power electronic assembly. The textured surface may generate a plurality of nucleation sites in two-phase cooling applications along an exterior of the metal substrate in the form of depressions and/or indentations that are sized and shaped to receive a cooling fluid therein. One non-limiting example of a method for forming an assembly (e.g., a power electronics assembly) includes positioning a plurality of polymer spheres against a metal substrate along a top surface thereof and electroplating the top surface by applying an electrical current at a low current density (e.g., ranging from about 50 milliampere per square centimeter (mA/cm$^2$) or less) through the metal substrate.

Electroplating the top surface of the metal substrate with the plurality of polymer spheres positioned thereon may cause a diffusion of metal from the metal substrate. In response to the application of the low current density, the metal is deposited along a bottom surface of the plurality of polymer spheres. Removing the plurality of polymer spheres with a solution exposes and/or forms a textured surface along the top surface of the metal substrate. The textured surface is defined by a plurality of dimples and a plurality of depressions that are sized and shaped in accordance with a profile of the plurality of polymer spheres positioned against the top surface. Accordingly, the plurality of dimples and the plurality of protrusions of the textured surface are disposed along the top surface of the metal substrate.

With the plurality of dimples and the plurality of protrusions positioned along the metal substrate, a plurality of nucleation sites are formed that are sized and shaped to receive a cooling fluid therein, such as, for example, a cooling apparatus coupled to the assembly along the textured surface. In particular, the plurality of nucleation sites formed by the plurality of dimples and the plurality of protrusions are configured to enhance a boiling of a cooling fluid received along the top surface of the metal substrate. Various embodiments of power electronic assemblies including the plurality of nucleation sites and methods for forming said nucleation sites along the metal substrate will be described in greater detail herein.

Referring initially to FIG. 1, a non-limiting example of an assembly 100, such as, for example, an electronics assembly, is illustrated. The example assembly 100 generally includes a semiconductor device 110 with a first surface 112 and a second surface 114, and a substrate 120 with a first surface 122 and a second surface 124. The substrate 120 is bonded to the semiconductor device 110, and more specifically the second surface 124 of the substrate 120 is bonded to the first surface 112 of the semiconductor device 110. The first surface 122 of the substrate 120 includes a metal layer 126 formed thereon. The metal layer 126 is integrally formed with the substrate 120 and includes a textured surface 127 with a plurality of dimples 128 and a plurality of protrusions 129. In some embodiments, the metal layer 126 of the substrate 120 is utilized in a cooling application, such as, for example, a two-phase cooling application where the metal layer 126 is fluidly coupled to a cooling apparatus 180.

The cooling apparatus 180 defines a coolant chamber 182 that is coupled to the substrate 120 along the first surface 122. In this instance, the coolant chamber 182 of the cooling apparatus 180 is in fluid communication with the metal layer 126 disposed along the first surface 122. As described in greater detail herein, the metal layer 126 creates a plurality of nucleation sites along the textured surface 127 to enhance boiling of a cooling fluid received therein via the coolant chamber 182 of the cooling apparatus 180. In other words, the textured surface 127 is configured to receive a fluid within the coolant chamber 182 to facilitate heat transfer generated from the semiconductor device 110.

Still referring to FIG. 1, the semiconductor device 110 may generally be any electronic device that uses semiconductor materials. In some embodiments, the semiconductor device 110 may be formed from a wide band gap semiconductor material suitable for the manufacture or production of power semiconductor devices, such as, for example, a power insulated-gate bi-polar transistor (IGBTs), a power metal-oxide field-effect transistor (MOSFET), a power transistor, and the like. In some embodiments, the semiconductor device 110 may be formed from wide band gap semiconductor materials. Non-limiting examples of such wide band gap semiconductor materials include silicon carbide (SiC), aluminum nitride (AlN), gallium nitride (GaN), gallium oxide (Ga$_2$O$_3$), boron nitride (BN), diamond, and/or the like.

The substrate 120 serves as a bottom substrate for the assembly 100 and may be formed of any type of material, particularly those that are used for power semiconductor device assemblies. Non-limiting examples include metal substrates, e.g., substrates formed from copper (Cu), e.g., oxygen free Cu, aluminum (Al), Cu alloys, Al alloys, and the like, direct bonded copper substrates or semiconductor (e.g., silicon) substrates. In embodiments, the substrate 120 may be plated with a metal on an exterior surface, such as, for example, aluminum (Al), nickel (N), and the like. As will be described in greater detail herein, the substrate 120 may be formed from a thermally conductive material such that heat from the semiconductor device 110 is transferred to the substrate 120.

Still referring to FIG. 1, the thickness of the semiconductor device 110 and the substrate 120 may depend on the intended use of the assembly 100. In non-limiting examples, the semiconductor device 110 has a thickness of about 0.1 millimeters to about 0.3 millimeters, and the substrate 120 has a thickness of about 1.0 millimeter to about 2.0 millimeters. In this instance, the assembly 100 may have a maximum height of about 1.1 millimeters to about 2.3 millimeters. It should be understood that other thicknesses of the semiconductor device 110 and/or the substrate 120 may be utilized in assembly 100 without departing from the scope of the present disclosure.

The substrate 120 includes the metal layer 126 disposed along the first surface 122. The textured surface 127 of the metal layer 126 includes the plurality of dimples 128 formed between the plurality of protrusions 129 that are securely adhered to the first surface 122 of the substrate 120. In this instance, the plurality of dimples 128 and the plurality of protrusions 129 of the textured surface 127 are integrally formed with the substrate 120. It should be understood that the plurality of dimples 128 and/or the plurality of protrusions 129 of the textured surface 127 may include various sizes, shapes, and/or configurations along the first surface 122 of the substrate 120 than those shown and described herein.

Still referring to FIG. 1, it should be understood that a number of the plurality of dimples 128, the plurality of protrusions 129 and/or other surface features present on the textured surface 127 of the metal layer 126 formed along the first surface 122 of the substrate 120 is not limited by the present disclosure, and may be any number so long as the connectivity between the material of the metal layer 126 and the first surface 122 of the substrate 120 is maintained. While the plurality of dimples 128 is depicted as being generally semi-spherical in shape, this is merely illustrative. Accordingly, it should be understood that the plurality of dimples 128 may be any shape, including, for example, spherical, cylindrical, and/or irregular shapes. The shape of the dimples 128 may be determined from the shape of the materials used to form the plurality of protrusions 129 of the textured surface 127 (i.e., the polymer spheres). In other embodiments, the plurality of dimples 128 and the plurality of protrusions 129 of the textured surface 127 of the metal layer 126 may be positioned along various other surfaces of the substrate 120 and/or other components of the assembly 100.

Figure 2A:
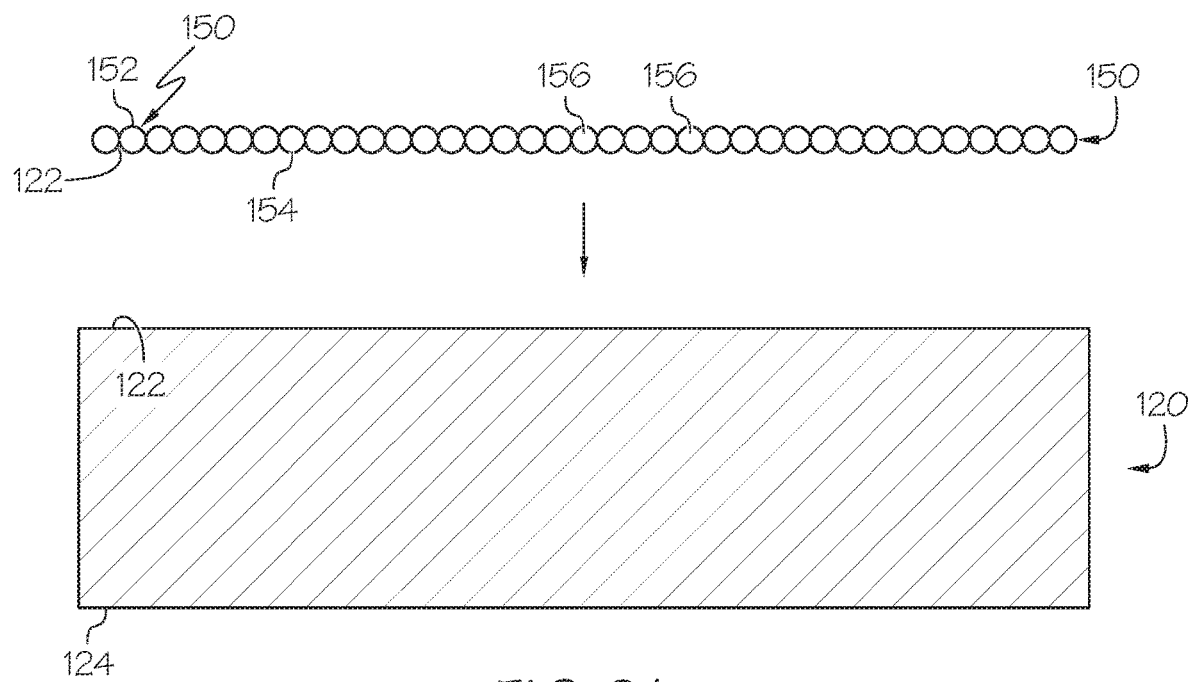
FIG. 2A schematically depicts a method of fabricating the assembly of FIG. 1 by positioning a plurality of polymer spheres against the metal substrate according to one or more embodiments shown and described herein.
Figure 2B:
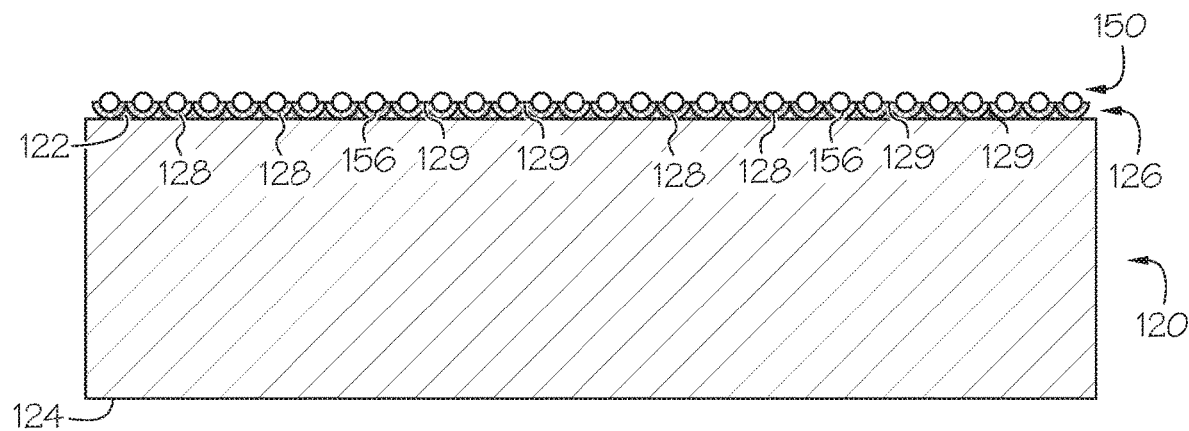
FIG. 2B schematically depicts a method of fabricating the assembly of FIG. 1 by electroplating the metal substrate to diffuse metal along the plurality of polymer spheres according to one or more embodiments shown and described herein.

As described in greater detail herein, the plurality of dimples 128 and the plurality of protrusions 129 of the textured surface 127 of the metal layer 126 may be formed along the substrate 120 in response to an electrodeposition of the first surface 122 with a plurality of polymer spheres 150 positioned thereon (see FIG. 2B). In particular, a plurality of polymer spheres 150 deposited along the first surface 122 of the substrate 120 may be electroplated at a low current density to thereby form the metal layer 126 thereon upon removal of the polymer spheres 150 from the substrate 120.

The metal layer 126 may be formed from a thermally conductive material such that heat from the semiconductor device 110 is transferred to the metal layer 126 via the substrate 120 interlaid between the semiconductor device 110 and the metal layer 126. The metal layer 126 is configured to form a plurality of nucleation sites within the plurality of dimples 128 of the textured surface 127 for receiving a cooling fluid therein, such as, for example, from a cooling device coupled thereto (e.g., a heat sink). As described in greater detail herein, a thickness of the metal layer 126 may depend on the intended use of the assembly 100 and/or a predetermined duration of electroplating the first surface 122 of the substrate 120. Transferring heat generated by the semiconductor device 110 via fluid that is received along the textured surface 127 of the metal layer 126 is optimal for cooling the assembly 100 during use.

Still referring to FIG. 1, with the plurality of dimples 128 and the plurality of protrusions 129 of the textured surface 127 of the metal layer 126 integrally formed with the first surface 122 of the substrate 120, the plurality of dimples 128 and the plurality of protrusions 129 may be formed of a material substantially similar to the substrate 120. For example, the metal layer 126 may be formed any type of material, particularly those that are used for power semiconductor device assemblies. Non-limiting examples include copper (Cu), oxygen free Cu, aluminum (Al), Cu alloys, Al alloys, and the like, direct bonded copper substrates or semiconductor (e.g., silicon) substrates. Accordingly, and as described above, the plurality of dimples 128 and the plurality of protrusions 129 may be formed from a thermally conductive material such that heat from the semiconductor device 110 is transferred thereto via the substrate 120, but is otherwise not limited by the present disclosure. In some embodiments, the material used for the metal layer 126 may be selected based on the process used to form the metal layer 126, as described in greater detail herein.

Further, a thickness of the metal layer 126 is not limited by the present disclosure, and may generally be any thickness. For instance, a thickness of the plurality of dimples 128 and the plurality of protrusions 129 of the textured surface 127 of the metal layer 126 may depend on a density of electrical current applied to the substrate 120 to electroplate the first surface 122 of the substrate 120, and/or a size, shape and/or thickness of the plurality of polymer spheres 150 positioned thereon during the electroplating process. The plurality of protrusions 129 of the textured surface 127 are configured to define depressions or indentations (i.e. the plurality of dimples 128) along the first surface 122 of the substrate 120 during said electroplating process such that fluid introduced into the textured surface 127 of the metal layer 126 can flow into each of the plurality of dimples 128 along the first surface 122 of the substrate 120 and contact a greater amount of surface area for the purposes of boiling the fluid thereon.

The metal layer 126 may facilitate a thermal conductivity for the semiconductor device 110 via the substrate 120 interlaid therebetween. In particular, the plurality of protrusions 129 of the textured surface 127 define a plurality of dimples 128 (or other similar depressions or indentations) such that fluid introduced into the assembly 100 can flow into each of the plurality of dimples 128 along the metal layer 126 and contact a greater amount of surface area for the purposes of heat transfer. Such fluid may include a cooling fluid from a cooling apparatus that is directly coupled to the textured surface 127 such that the fluid is received in the plurality of dimples 128, which is in contact with the semiconductor device 110 via the substrate 120. In this instance, the fluid is boiled within the plurality of dimples 128 in response to a transfer of heat generated by the semiconductor device 110 while in use, thereby cooling the assembly 100.

In other words, as fluid flows into the plurality of dimples 128 and/or other surface features of the textured surface 127 of the metal layer 126, latent heat of the assembly 100 is absorbed by the fluid due to the relative cooler temperature of the fluid. Additionally, with the heat effectively absorbed by the fluid received in the plurality of dimples 128 of the textured surface 127, the heat is transferred through the metal layer 126 with the movement of the fluid to other portions of the assembly 100 to draw the heat away from the one or more heat generating devices (i.e., the semiconductor device 110). While the plurality of protrusions 129 of the present example are specifically shown and described herein as defining a series of dimples 128 throughout the textured surface 127 of the metal layer 126, other surface features contained within the metal layer 126 may also be included without departing from the scope of the present disclosure.

Figure 2C:
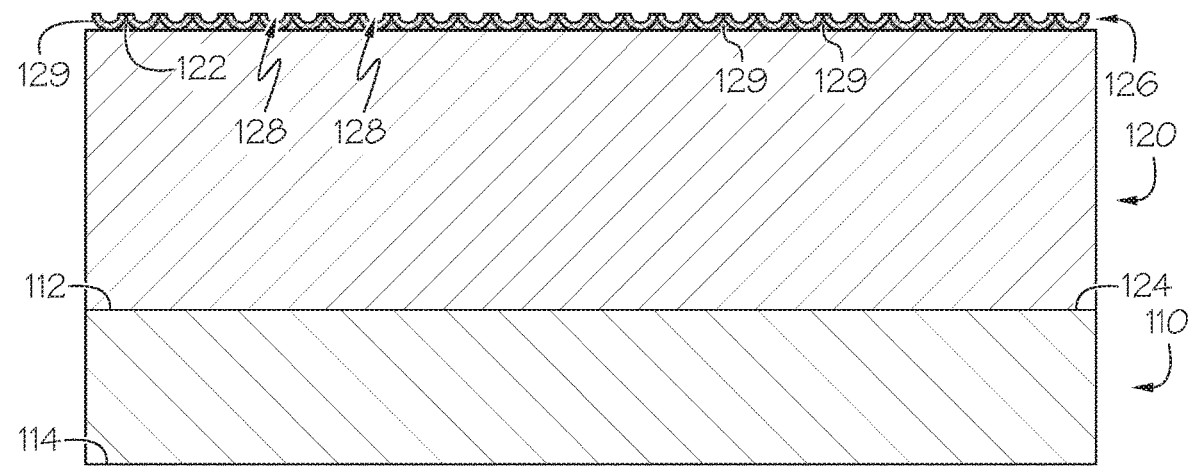
FIG. 2C schematically depicts a method of fabricating the assembly of FIG. 1 by dissolving the plurality of polymer spheres from the metal substrate to form a textured surface and bonding a device substrate to the metal substrate according to one or more embodiments shown and described herein.
Figure 3A:
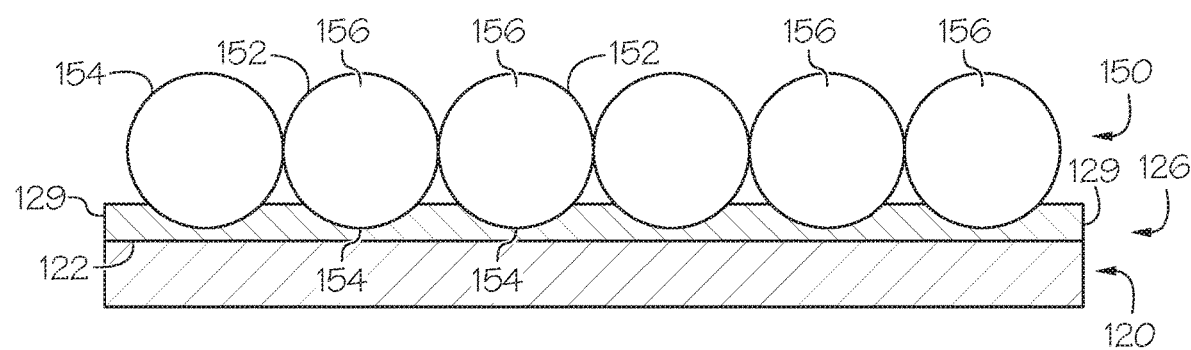
FIG. 3A schematically depicts a method of fabricating the assembly of FIG. 1 by electroplating the metal substrate to diffuse metal along a bottom surface of the plurality of polymer spheres according to one or more embodiments shown and described herein.
Figure 3B:
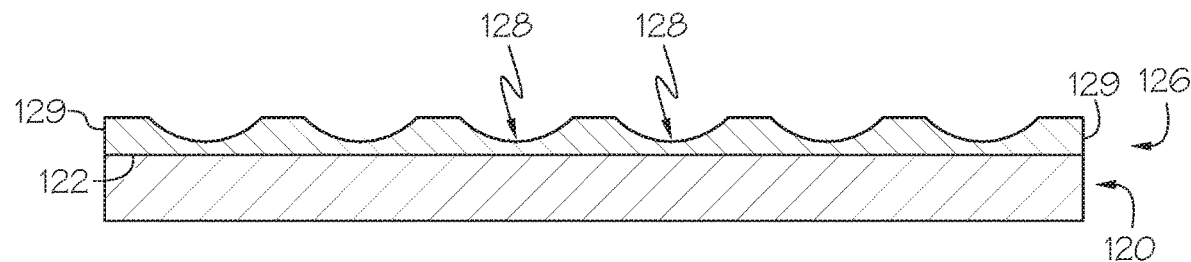
FIG. 3B schematically depicts a method of fabricating the assembly of FIG. 1 by dissolving the plurality of polymer spheres from the metal substrate to form a textured surface according to one or more embodiments shown and described herein.
Figure 4:
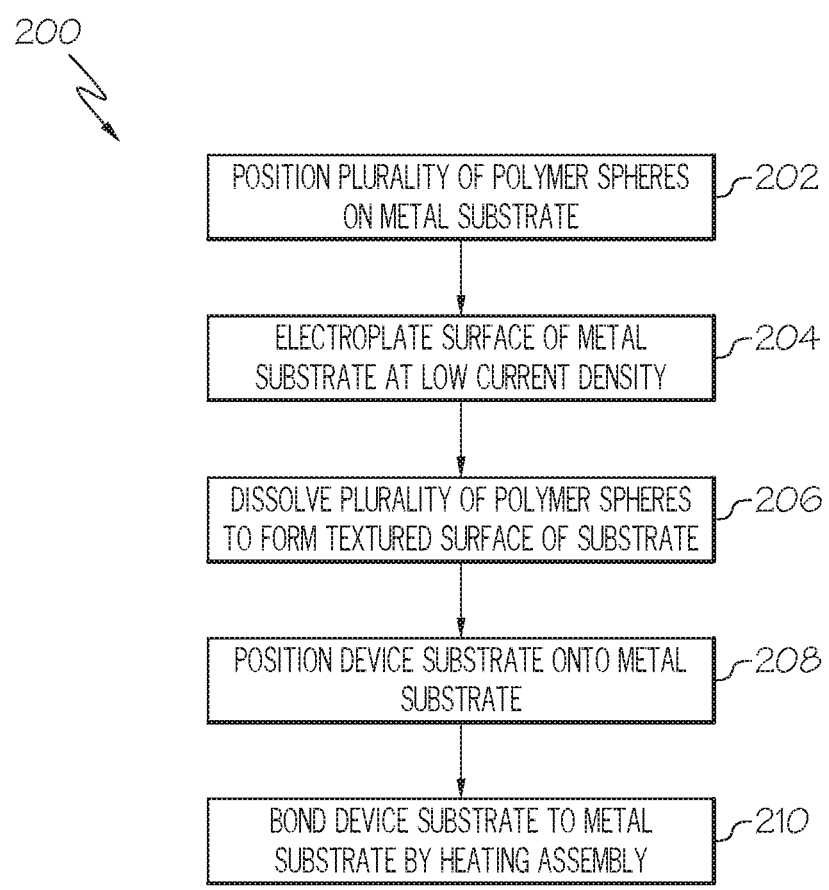
FIG. 4 depicts a flow diagram of an illustrative method of forming the assembly of FIG. 1 according to one or more embodiments shown and described herein.

Referring now to FIGS. 2A-2C, 3A-B and the flow chart of FIG. 4, an example method 200 for forming the assembly 100, and more particularly the substrate 120 with the metal layer 126 generally described above is shown. It should be understood that method 200 is merely illustrative and that the assembly 100 may be formed via other methods. At block 202, and as depicted in FIG. 2A, the plurality of polymer spheres 150 are positioned against the substrate 120, and in particular a bottom surface 154 of each of the plurality of polymer spheres 150 is received along the first surface 122 of the substrate 120. It should be understood that in other embodiments, the plurality of polymer spheres 150 may be deposited on other various surfaces of the substrate 120 and/or other devices of the assembly 100.

In this instance, the plurality of polymer spheres 150 and the substrate 120 are not bonded together by an intermediary bonding layer disposed therebetween. It should further be understood that in some embodiments additional layers of the plurality of polymer spheres 150 may be secured to the substrate 120 without departing from the scope of the present disclosure.

Each polymer sphere 150 of the plurality of polymer spheres 150 includes a body 156 disposed between the top surface 152 of the polymer sphere 150 and the bottom surface 154 of the polymer sphere 150. The body 156 of the plurality of polymer spheres 150 may comprise various shapes, sizes, and/or configurations. For example, in some embodiments the body 156 of the plurality of polymer spheres 150 are sized approximately 5 microns or less, however, it should be understood that the body 156 may include various other sizes without departing from the scope of the present disclosure. In this instance, the bottom surface 154 of the body 156 of each of the plurality of polymer spheres 150 is in contact with and positioned against the first surface 122 of the substrate 120. As a non-limiting example, the plurality of polymer spheres is made of polystyrene.

At block 204, and as depicted FIG. 2B, the first surface 122 of the substrate 120 is electroplated at a low current density to thereby form the metal layer 126 thereon. In particular, an electrical current is passed through the assembly 100 at a relatively low current density ranging from about 50 milliampere per square centimeter (mA/cm$^2$) or less. In this instance, by applying a low current density to the first surface 122 of the substrate 120 during the electroplating process, metal (e.g., copper) is deposited on the first surface 122 of the substrate 120. With the plurality of polymer spheres 150 disposed along the first surface 122 of the substrate 120 during the electroplating process, metal is deposited around the bottom surfaces 154 of each of the plurality of polymer spheres 150 and on the first surface 122 of the substrate 120. More specifically, the metal deposited on the first surface 122 of the substrate 120 extends outwardly therefrom toward the bottom surface 154 of the plurality of polymer spheres 150. In this instance, the diffused copper fills the voids between the plurality of polymer spheres 150.

Referring now to FIG. 3A, the metal layer 126 is gradually formed with the textured surface 127, and more specifically the plurality of protrusions 129, extending outwardly from the first surface 122 of the substrate 120 along an exterior of the plurality of polymer spheres 150. A size and shape of the plurality of dimples 128 and the plurality of protrusions 129 is dependent on a size and shape of the body 156 of the plurality of polymer spheres 150 on the first surface 122. Further, an extent and rate of growth of the metal layer 126 is dependent on a level of current density applied to the substrate 120 during the electroplating process, and a duration of the electroplating process. With the current density maintained at a relatively low level, and the electroplating process maintained at a predetermined, and relatively short duration (e.g., ten minutes), only the first surface 122 of the substrate 120 is effectively electroplated.

In this instance, the plurality of polymer spheres 150 are raised relative to the first surface 122 of the substrate 120. In particular, metal diffused from the first surface 122 of the substrate 120 are deposited along the bottom surface 154 of the plurality of polymer spheres 150 positioned against the first surface 122 thereby lifting the plurality of polymer spheres 150 off of the first surface 122 of the substrate 120 as the metal layer 126 is formed. The inclusion of the plurality of polymer spheres 150 along the first surface 122 inhibits a material of the substrate 120 (e.g., copper) from being uniformly electroplated over the plurality of polymer spheres 150, as the copper diffused therefrom are effectively deposited underneath and/or along the bottom surface 154 of the plurality of polymer spheres 150, thereby forming the metal layer 126. Although in the present example the electroplating process forming the metal layer 126 is described as being conducted prior to an attachment of the semiconductor device 110, it should be understood that in other embodiments the first surface 122 of the substrate 120 may be electroplated after and/or simultaneously with a deposition of the semiconductor device 110 onto the substrate 120.

It should be understood that in response to the plurality of polymer spheres 150 being positioned against the first surface 122 during the electroplating process of the substrate 120, the metal layer 126 forming the textured surface 127 with the plurality of dimples 128 and the plurality of protrusions 129 is effectively generated at the first surface 122. Accordingly, as a portion of the cooper from the first surface 122 of the substrate 120 contacts the bottom surface 154 of the plurality of polymer spheres 150, copper is effectively diffused from the first surface 122 and bonded to the body 156 of the plurality of polymer spheres 150.

Referring now to FIG. 2C and at block 206, the plurality of polymer spheres 150 are removed from the assembly 100 to form the textured surface 127 of the metal layer 126, and in particular, the plurality of dimples 128 and the plurality of protrusions 129 formed along the first surface 122 of the substrate 120. It should be understood that the plurality of polymer spheres 150 may be removed from the assembly 100 via various methods, including, but not limited to, dissolving the plurality of polymer spheres 150 with a solution (e.g., a hydrofluoric acid solution) to thereby uncover the textured surface 127 of the metal layer 126 disposed between the bottom surface 154 of the polymer spheres 150 and the first surface 122 of the substrate 120. Although in the present example the plurality of polymer spheres 150 are described as being removed prior to an attachment of the semiconductor device 110 to the substrate 120, it should be understood that in other embodiments the plurality of polymer spheres 150 may be removed from the assembly 100 after and/or simultaneously with securement of the semiconductor device 110 to the assembly 100.

As seen in FIG. 3B, the plurality of polymer spheres 150 is removed from the first surface 122 of the substrate 120 to form a patterned structure thereon, and in particular, the textured surface 127 of the metal layer 126. In other words, with the plurality of polymer spheres 150 disposed over the first surface 122 of the substrate 120 during the electroplating process at block 204, a plurality of nucleation sites are effectively formed on the substrate 120, and in particular, along the textured surface 127 of the metal layer 126 where the plurality of polymer spheres 150 engage the substrate 120, upon removal of the polymer spheres 150. Removal of the plurality of polymer spheres 150 may generally be completed via any removal processes, particularly removal processes that are suitable for removing the material used for the plurality of polymer spheres 150 (e.g., a polymer).

For example, an etching process may be used to remove the plurality of polymer spheres 150. In some embodiments, a hydrofluoric acid solution may be used as an etchant to etch away the plurality of polymer spheres 150. Other methods that cause the plurality of polymer spheres 150 to be removed or otherwise dissolved should generally be understood. As a result of this process, the plurality of protrusions 129 defining the plurality of dimples 128 of the textured surface 127 of the metal layer 126 are formed and/or revealed on the substrate 120. Other methods that cause the plurality of polymer spheres 150 to be removed or otherwise dissolved should generally be understood.

At block 208, and referring back to FIG. 2C, the semiconductor device 110 may be placed on the substrate 120. For instance, the first surface 112 of the semiconductor device 110 may be deposited onto the second surface 124 of the substrate 120 opposite of the metal layer 126. At block 210, the semiconductor device 110 may be bonded to the substrate 120 via solder, thermal bonding, transient liquid phase (TLP) bonding, and/or the like. It should be understood that TLP bonding may be particularly used in instances where the semiconductor device 110 is a wide bandgap semiconductor device that operates at relatively high temperatures (e.g., at a temperature of about 200° Celsius or greater than about 200° Celsius). This is particularly due to the TLP bond layers being capable of adhering the components of the assembly 100 (i.e., the semiconductor device 110, and/or the substrate 120) at relatively high temperatures better than other layers, such as, for example, a solder layer.

In other embodiments, and as briefly described above, additional and/or fewer polymer spheres 150 may be included in the assembly 100, and in particular, deposited along the first surface 122 of the substrate 120 to provide a greater or lesser quantity of dimples 128 and/or protrusions 129 along the metal layer 126 when electroplating the substrate 120 at the low current density. Additional polymer spheres 150 may be positioned along other surfaces of the substrate 120 and/or along one or more surfaces of other devices or components of the assembly 100 to provide additional textured surfaces configured to form nucleation sites for boiling a cooling fluid therein. It should also be understood that in some embodiments, dependent on a location of the plurality of polymer spheres 150, melting the plurality of polymer spheres 150 may facilitate an adhesion of the substrate 120 to another device or component of the assembly 100.

Referring back to FIG. 1, upon removal of the plurality of polymer spheres 150 from the assembly 100 and bonding of the semiconductor device 110 thereto, a cooling apparatus, such as, for example, a heat sink, may be bonded to the assembly 100 at the metal layer 126. In this instance, the heat sink may remove heat generated by the semiconductor device 110 and transferred to the heat sink via the metal layer 126 to effectively lower an operating temperature of the assembly 100. As described in greater detail above, the heat sink may transfer a cooling fluid into the plurality of nucleation sites defined by the plurality of dimples of the metal layer 126 such that the heat generated by the semiconductor device 110 is transferred thereto via the substrate 120 and boils the cooling fluid therein, effectively reducing an operating temperature of the assembly 100.

It should now be understood that the methods for fabricating a power electronic assembly, and in particular bonding a semiconductor device to a metal substrate that includes a textured surface layer, may be utilized to generate nucleation sites to facilitate boiling of a cooling fluid therein during operation of the assembly. In particular, the integration of one or more polymer spheres along the metal substrate and application of a low current density during an electroplating process of the fabrication method described herein may provide a simplified process for generating a textured surface along a component capable with nucleation sites for boiling a fluid therein to cool the assembly during operation.

It is noted that the term "about" and "generally" may be utilized herein to represent the inherent degree of uncertainty that may be attributed to any quantitative comparison, value, measurement, or other representation. This term is also utilized herein to represent the degree by which a quantitative representation may vary from a stated reference without resulting in a change in the basic function of the subject matter at issue. The terms "top", "bottom" and "middle" are used in relation to the figures and are not meant to define an exact orientation of power electronics assemblies or layers used to form power electronic assemblies described herein.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A method of forming a textured surface along a metal substrate comprising:
    disposing a plurality of polymer spheres on a surface of the metal substrate;
    electroplating the metal substrate at a current density to deposit a metal layer along a body of each of the plurality of polymer spheres disposed on the surface of the metal substrate, wherein the metal layer does not extend above a top surface of the plurality of polymer spheres; and
    removing the plurality of polymer spheres from the metal layer to form the textured surface defined by a size and shape of the plurality of polymer spheres.

2. The method of claim 1, wherein the textured surface is defined by a plurality of protrusions and a plurality of dimples.

3. The method of claim 2, wherein each of the plurality of dimples is disposed between and defined by an adjacent pair of protrusions of the plurality of protrusions.

4. The method of claim 2, further comprising selectively adjusting a thickness of the plurality of protrusions and the plurality of dimples of the textured surface by manipulating a predetermine duration of the electroplating.

5. The method of claim 2, further comprising ceasing the electroplating after a predetermined duration to control a thickness of the metal layer.

6. The method of claim 5, wherein the predetermination duration is less than or equal to approximately ten minutes.

7. The method of claim 1, further comprising coupling a cooling apparatus to the metal layer.

8. The method of claim 1, wherein the metal layer includes a material composition similar to the metal substrate.

9. The method of claim 1, wherein the metal layer includes a material composition different than the metal substrate.

10. The method of claim 1, wherein the current density is less than or equal to approximately 50 milliampere per square centimeter ($mA/cm^2$).

11. The method of claim 1, wherein removing the plurality of polymer spheres comprises dissolving the plurality of polymer spheres with a solution.

12. The method of claim 1, further comprising bonding a semiconductor device onto a second surface of the metal substrate that is opposite of the metal layer.

* * * * *